US008824076B2

(12) United States Patent  
Pan et al.

(10) Patent No.: US 8,824,076 B2  
(45) Date of Patent: Sep. 2, 2014

(54) SYSTEMS AND METHODS FOR NPML CALIBRATION (75) Inventors: Lu Pan, Milpitas, CA (US); Seongwook Jeong, Sunnyvale, CA (US); Haitao Xia, San Jose, CA (US)

(73) Assignee: LSI Corporation, San Jose, CA (US)

( * ) Notice: Subject to any disclaimer, the term of this patent is extended or adjusted under 35 U.S.C. 154(b) by 85 days.

(21) Appl. No.: 13/597,046

(22) Filed: Aug. 28, 2012

(65) Prior Publication Data

US 2014/0063637 A1 Mar. 6, 2014

(51) Int. Cl.
*G11B 5/09* (2006.01)

(52) U.S. Cl.
USPC ......... 360/39; 360/53; 369/53.31; 369/53.35; 375/341; 375/346; 702/191; 708/300; 714/795; 714/796

(58) Field of Classification Search
CPC .................. G11B 20/10037; G11B 20/10046; G11B 20/10277; G11B 20/10287; G11B 20/10296
See application file for complete search history.

(56) References Cited

U.S. PATENT DOCUMENTS

| 6,535,553 | B1 | 3/2003 | Limberg et al. |
|---|---|---|---|
| 7,248,630 | B2 | 7/2007 | Modrie |
| 7,257,764 | B2 | 8/2007 | Suzuki |
| 7,421,017 | B2 | 9/2008 | Takatsu |
| 7,502,189 | B2 | 3/2009 | Sawaguchi |
| 7,715,471 | B2 | 5/2010 | Werner |
| 8,018,360 | B2 | 9/2011 | Nayak |
| 8,046,666 | B2 | 10/2011 | Park et al. |
| 8,184,390 | B1 | 5/2012 | Xia et al. |
| 8,208,213 | B2 | 6/2012 | Liu |
| 2004/0071206 | A1 | 4/2004 | Takatsu |
| 2005/0249318 | A1 | 11/2005 | Minemura |
| 2006/0123285 | A1 | 6/2006 | De Araujo |
| 2006/0176947 | A1 | 8/2006 | Lim |
| 2006/0259263 | A1 | 11/2006 | Ashley et al. |
| 2007/0263310 | A1 * | 11/2007 | Ikeda et al. ............... 360/39 |
| 2009/0002862 | A1 | 1/2009 | Park et al. |
| 2009/0161245 | A1 | 6/2009 | Mathew et al. |
| 2009/0161747 | A1 | 6/2009 | Aziz et al. |
| 2009/0268575 | A1 | 10/2009 | Tan et al. |
| 2011/0072335 | A1 | 3/2011 | Liu et al. |
| 2011/0075569 | A1 | 3/2011 | Marrow |
| 2011/0164332 | A1 | 7/2011 | Cao |
| 2011/0167227 | A1 | 7/2011 | Yang et al. |
| 2012/0019946 | A1 | 1/2012 | Aravind |
| 2012/0056612 | A1 | 3/2012 | Mathew |
| 2012/0069891 | A1 | 3/2012 | Zhang |
| 2012/0124119 | A1 | 5/2012 | Yang |
| 2012/0236430 | A1 | 9/2012 | Tan |

OTHER PUBLICATIONS

U.S. Appl. No. 13/535,799, filed Jun. 28, 2012, Madhusudan Kalluri, Unpublished.
U.S. Appl. No. 13/551,507, filed Jul. 17, 2012, Ming Jin, Unpublished.
U.S. Appl. No. 13/562,140, filed Jul. 30, 2012, Haotian Zhang, Unpublished.
U.S. Appl. No. 13/525,188, filed Jun. 15, 2012, Yang Han, Unpublished.

(Continued)

Primary Examiner — Wayne Young
Assistant Examiner — Brian Butcher
(74) Attorney, Agent, or Firm — Hamilton DeSanctis & Cha (57) ABSTRACT The present invention is related to systems and methods for adaptive parameter modification in a data processing system.

20 Claims, 5 Drawing Sheets (56) References Cited

OTHER PUBLICATIONS

U.S. Appl. No. 13/491,062, filed Jun. 7, 2012, Jin Lu, Unpublished.
U.S. Appl. No. 13/525,182, filed Jun. 15, 2012, Yang Han, Unpublished.
U.S. Appl. No. 13/346,556, filed Jan. 9, 2012, Haitao Xia, Unpublished.
U.S. Appl. No. 13/239,719, filed Sep. 22, 2011, Haitao Xia, Unpublished.
U.S. Appl. No. 13/272,209, filed Oct. 12, 2011, Yu Liao, Unpublished.
U.S. Appl. No. 13/545,784, filed Jul. 10, 2012, Yu Liao, Unpublished.

* cited by examiner

SYSTEMS AND METHODS FOR NPML CALIBRATION

BACKGROUND OF THE INVENTION

The present invention is related to systems and methods for performing data processing, and more specifically to systems and methods for adaptive parameter modification in a data processing system.

Various data transfer systems have been developed including storage systems, cellular telephone systems, radio transmission systems. In each of the systems data is transferred from a sender to a receiver via some medium. For example, in a storage system, data is sent from a sender (i.e., a write function) to a receiver (i.e., a read function) via a storage medium. The effectiveness of any transfer is impacted by noise arising in the data transfer. To deal with such noise, some data processing systems utilize noise predictive filtering as part of a data detection process. However, in some cases, existing noise predictive filtering leads to inaccurate results in various noise scenarios.

Hence, for at least the aforementioned reasons, there exists a need in the art for advanced systems and methods for data processing.

BRIEF SUMMARY OF THE INVENTION

The present invention is related to systems and methods for performing data processing, and more specifically to systems and methods for adaptive parameter modification in a data processing system.

Some embodiments of the present invention provide data processing systems that include at least a first noise predictive filter circuit and a second noise predictive filter circuit. Operation of the first noise predictive filter circuit is based at least in part on a first coefficient set, and operation of the second noise predictive filter circuit is based at least in part on a second coefficient set. A forced variance filter coefficient adaptation circuit is also included that is operable to adapt the first coefficient set and the second coefficient set while constraining at least one of a first variance of the first coefficient set and a second variance of the second coefficient set to a defined variance.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems and methods for performing data processing, and more specifically to systems and methods for adaptive parameter modification in a data processing system.

Various embodiments of the present invention provide data processing circuits that include a data detector circuit and a data decoder circuit. The data detector circuit includes one or more noise predictive maximum likelihood (NPML) filtering circuits as part of the data detector circuit. A detected output from the data detector circuit is provided to the data decoder circuit that applies a data decode algorithm in an attempt to recover an originally written data set. Where application of the data decode algorithm yields the originally written data set, the decoded output is said to have "converged". In some cases, such convergence is indicated by satisfaction of all parity check equations relied upon in the data decode algorithm. Based upon the disclosure provided herein, one of ordinary skill in the art will recognize a variety of scenarios in which the decoded output is considered to have converged. Such a converged data set is provided as an output from the data processing circuit. A pass through both the data detector circuit and the data decoder circuit is referred to herein as a "global iteration". In some cases, the data processing circuit is designed to allow multiple global iterations. In various cases, the data decoding circuit may apply the data decode algorithm to the detected output multiple times during a given global iteration. In such cases, each application of the data decode algorithm is referred to herein as a "local iteration".

Operation of the NPML filtering circuits is governed by one or more filter coefficients that may be adaptively updated. Such adaptive updating of the filter coefficients is done using converged outputs and corresponding inputs. In some instances of the aforementioned embodiments, the coefficients provided to the NPML filtering circuits are adapted using an adaptation process including forcing a defined variance between the coefficients of one of the NPML filtering circuits and maintaining the forced variance while changing the coefficient values to yield an acceptable result. In some instances of present invention, all of the coefficient values are allowed to change while the variance between the coefficients is forced to a defined variance. In addition, other NPML filtering circuits are adapted without restricting the variance between the respective coefficients. The resulting coefficients are then normalized to exhibit the same variance as the defined variance. The resulting coefficients are provided to the data detector circuit where they are used to govern operation of the NPML filtering circuits.

Some embodiments of the present invention provide data processing systems that include at least a first noise predictive filter circuit and a second noise predictive filter circuit. Operation of the first noise predictive filter circuit is based at least in part on a first coefficient set, and operation of the second noise predictive filter circuit is based at least in part on a second coefficient set. A forced variance filter coefficient adaptation circuit is also included that is operable to adapt the first coefficient set and the second coefficient set while constraining at least one of a first variance of the first coefficient set and a second variance of the second coefficient set to a defined variance. In some instances of the aforementioned embodiments, adapting the first coefficient set and the second coefficient set includes constraining the first variance to the defined variance, and normalizing the second coefficient set such that the second variance is approximately equal to the first variance. In particular instances of the aforementioned embodiments, adapting the first coefficient set and the second coefficient set includes modifying the first coefficient set while constraining the first variance to the defined variance, and modifying the second coefficient set while constraining the second variance to the defined variance.

In one or more instances of the aforementioned embodiments, the first noise predictive filter circuit and the second noise predictive filter circuit are included in a data detection circuit. In such cases, the data detection circuit may further include a data detector circuit operable to apply a data detection algorithm guided by a first filtered output from the first noise predictive filter circuit and a second filtered output from the second noise predictive filter circuit. The data detection algorithm includes a branch metric calculation performed without relying on the first variance and the second variance. In some such instances, the data detection algorithm is a Viterbi data detection algorithm. In one or more such instances, the defined variance is selected such that the branch metric calculation can be done without the first variance and the second variance. In various of such instances, the data processing system further includes a data decoder circuit operable to apply a data decoding algorithm to the detected output to yield a decoded output. In some cases, the data decoding algorithm is a low density parity check algorithm.

Other embodiments of the present invention provide methods that include: adaptively calculating a first coefficient set, and adaptively calculating a second coefficient set. A variance of the first coefficient set is forced to a defined variance as part of the adaptive calculation. The methods further include applying a filter control derived from the second coefficient set to a second noise predictive filter circuit. Operation of the second noise predictive filter circuit is governed at least in part based on the second coefficient set. In some instances of the aforementioned embodiments, the methods further include normalizing the second coefficient set such that a variance of a resulting normalized coefficient set is approximately the same as the defined variance, wherein the filter control is the normalized coefficient set. In other instances of the aforementioned embodiments, the methods further include applying a data detection algorithm guided by a first filtered output from the first noise predictive filter circuit and a second filtered output from the second noise predictive filter circuit. The data detection algorithm includes a branch metric calculation performed without relying on the variance. In some cases, the data detection algorithm is a Viterbi data detection algorithm. In various cases, the methods further include selecting the defined variance is selected such that the branch metric calculation can be done without the first variance and the second variance. In one or more cases, the methods further include applying a low density parity check algorithm to the detected output to yield a decoded output. In some cases, the methods further include updating the first coefficient set to the first noise predictive filter circuit, and updating the second coefficient set is updated to the second noise predictive filter.

Figure 1A:
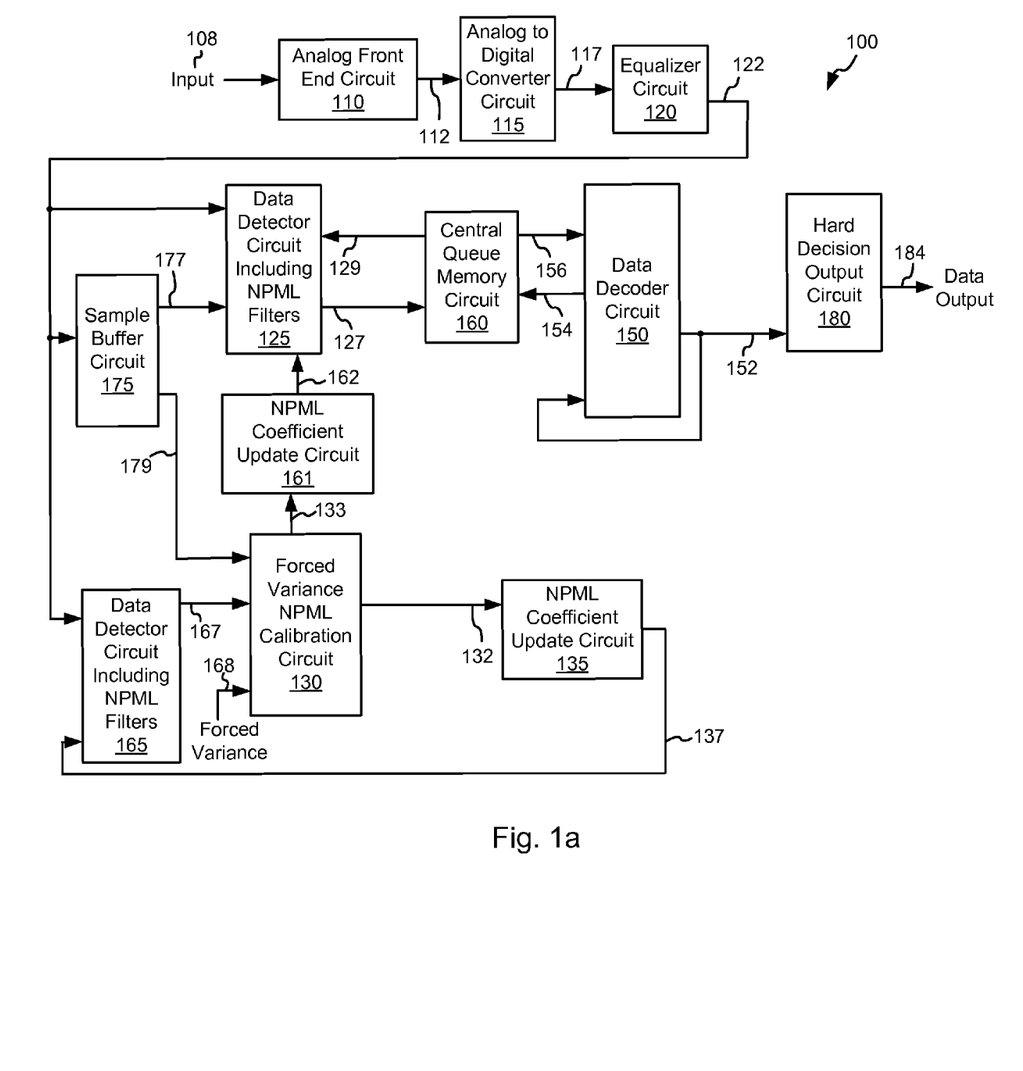
FIG. 1a-1b depicts a data processing circuit having forced variance NPML calibration circuitry in accordance with some embodiments of the present invention.

Turning to FIG. 1a, a data processing circuit 100 having a forced variance NPML calibration circuit 130 is shown in accordance with some embodiments of the present invention. Data processing circuit 100 includes an analog front end circuit 110 that receives an analog input 108. Analog front end circuit 110 processes analog input 108 and provides a processed analog signal 112 to an analog to digital converter circuit 115. Analog front end circuit 110 may include, but is not limited to, an analog filter and an amplifier circuit as are known in the art. Based upon the disclosure provided herein, one of ordinary skill in the art will recognize a variety of circuitry that may be included as part of analog front end circuit 110. In some cases, analog input 108 is derived from a read/write head assembly (not shown) that is disposed in relation to a storage medium (not shown). In other cases, analog input 108 is derived from a receiver circuit (not shown) that is operable to receive a signal from a transmission medium (not shown). The transmission medium may be wired or wireless. Based upon the disclosure provided herein, one of ordinary skill in the art will recognize a variety of sources from which analog input 108 may be derived.

Analog to digital converter circuit 115 converts processed analog signal 112 into a corresponding series of digital samples 117. Analog to digital converter circuit 115 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 117 are provided to an equalizer circuit 120. Equalizer circuit 120 applies an equalization algorithm to digital samples 117 to yield an equalized output 122. In some embodiments of the present invention, equalizer circuit 120 is a digital finite impulse response filter circuit as are known in the art.

Equalized output 122 is provided to both a data detector circuit 125 and to a sample buffer circuit 175. In some cases data detector circuit 125 includes a primary data detector circuit and a secondary data detector circuit. In such a case, equalized output 122 is provided to both the secondary data detector circuit and to sample buffer circuit 175. Sample buffer circuit 175 stores equalized output 122 as buffered data 177 for use in subsequent iterations through data detector circuit 125. Data detector circuit 125 may be any data detector circuit known in the art that is capable of producing a detected output 127. As some examples, data detector circuit 125 may be, but is not limited to, a Viterbi algorithm detector circuit or a maximum a posteriori detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Detected output 127 may include both hard decisions and soft decisions. The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present invention.

Detected output 127 is provided to a central queue memory circuit 160 that operates to buffer data passed between data detector circuit 125 and data decoder circuit 150. In some cases, central queue memory circuit 160 includes interleaving (i.e., data shuffling) and de-interleaving (i.e., data un-shuffling) circuitry known in the art. When data decoder circuit 150 is available, data decoder circuit 150 accesses detected output 127 from central queue memory circuit 160 as a decoder input 156. Data decoder circuit 150 applies a data decoding algorithm to decoder input 156 in an attempt to recover originally written data. The result of the data decoding algorithm is provided as a decoded output 152. Similar to detected output 127, decoded output 152 may include both hard decisions and soft decisions. For example, data decoder circuit 150 may be any data decoder circuit known in the art that is capable of applying a decoding algorithm to a received input. Data decoder circuit 150 may be, but is not limited to, a low density parity check (LDPC) decoder circuit or a Reed Solomon decoder circuit as are known in the art. Based upon the disclosure provided herein, one of ordinary skill in the art will recognize a variety of data decoder circuits that may be used in relation to different embodiments of the present invention. Where the original data is recovered (i.e., the data decoding algorithm converges) or a timeout condition occurs (e.g., if sample buffer circuit 175 is close to getting filled up), decoded output 152 is stored to a memory included in a hard decision output circuit 180. In turn, hard decision output circuit 180 provides the converged decoded output 152 as a data output 184 to a recipient (not shown). The recipient may be, for example, an interface circuit operable to receive processed data sets. Based upon the disclosure provided herein, one of ordinary skill in the art will recognize a variety of recipients that may be used in relation to different embodiments of the present invention. Where the original data is not recovered (i.e., the data decoding algorithm failed to converge) prior to a timeout condition, decoded output 152 indicates that the data is unusable as is more specifically discussed below, and data output 184 is similarly identified as unusable.

One or more iterations through the combination of data detector circuit 125 and data decoder circuit 150 may be made in an effort to converge on the originally written data set. As mentioned above, processing through both the data detector circuit and the data decoder circuit is referred to as a "global iteration". For the first global iteration, data detector circuit 125 applies the data detection algorithm to equalized output 122 without guidance from a decoded output. For subsequent global iterations, data detector circuit 125 applies the data detection algorithm to buffered data 177 as guided by decoded output 152. To facilitate this guidance, decoded output 152 is stored to central queue memory circuit 160 as a decoder output 154, and is provided from central queue memory circuit 160 as a detector input 129 when equalized output 122 is being re-processed through data detector circuit 125.

During each global iteration it is possible for data decoder circuit 150 to make one or more local iterations including application of the data decoding algorithm to decoder input 156. For the first local iteration, data decoder circuit 150 applies the data decoder algorithm without guidance from decoded output 152. For subsequent local iterations, data decoder circuit 150 applies the data decoding algorithm to decoder input 156 as guided by a previous decoded output 152. The number of local iterations allowed may be, for example, ten. Based upon the disclosure provided herein, one of ordinary skill in the art will recognize a variety of different numbers of local iterations that may be allowed in accordance with different embodiments of the present invention. Where the number of local iterations through data decoder circuit 150 exceeds that allowed, but it is determined that at least one additional global iteration during standard processing of the data set is allowed, decoded output 152 is provided back to central queue memory circuit 160 as decoded output 154. Decoded output 154 is maintained in central queue memory circuit 160 until data detector circuit 125 becomes available to perform additional processing.

In contrast, where the number of local iterations through data decoder circuit 150 exceeds that allowed and it is determined that the allowable number of global iterations has been surpassed for the data set and/or a timeout or memory usage calls for termination of processing of the particular data set, standard processing of the data set concludes and an error is indicated. In some cases, retry processing or some offline processing may be applied to recover the otherwise unconverged data set. Based upon the disclosure provided herein, one of ordinary skill in the art will recognize a variety of non-standard processing techniques that may be applied to recover the otherwise unrecoverable data set.

A parallel data detector circuit 165 receives equalized output 122 and applies a data detection algorithm thereto to yield a detected output 167. In some embodiments of the present invention, data detector circuit 165 is identical to data detector circuit 125. In other embodiments of the present invention, data detector circuit 165 is a simplified version of data detector circuit 125. Based upon the disclosure provided herein, one of ordinary skill in the art will recognize a variety of data detector circuits and/or algorithms that may be used in relation to data detector circuit 165. In contrast to detected output 127 that includes soft data, detected output 167 includes hard decisions identified during application of the data detection algorithm. The hard decisions provided as detected output 167 are provided to forced variance NPML calibration circuit 130 along with equalized output 122.

Each of data detector circuit 125 and data detector circuit 165 includes a number of NPML filter circuits as are known in the art. These NPML filter circuits operate based upon filter coefficients generated by forced variance NPML calibration circuit 130. Forced variance NPML calibration circuit 130 receives detected output 167, the received equalized data 179 from data sample buffer circuit 175 which is a stored version of equalized output 122, equalized output 122, and a forced variance target 168. In some embodiments of the present invention, forced variance target 168 is fixed, while in other embodiments of the present invention forced variance target 168 is user programmable. In one particular embodiment of the present invention, forced variance target 168 (i.e., $\delta^2$) is fixed at a value of four (4).

Forced variance NPML calibration circuit 130 repeatedly adjusts coefficients 132 based upon the combination of detected output 167 and one of equalized output 122 or equalized data 179 from data sample buffer circuit 175. The resulting coefficient set 132 is provided to an NPML coefficient update circuit 135. When data detector circuit 165 is free to be updated, NPML coefficient update circuit 135 transfers a coefficient set 137 corresponding to the previously stored coefficient set 132. In one particular embodiment of the present invention, NPML coefficient update circuit 135 is an asynchronous FIFO where they are stored until data detector circuit 165 is free to be updated.

In addition, the updated NPML coefficient sets are provided as coefficient sets 133 to an NPML coefficient update circuit 161 where they are stored until data detector circuit 125 is free to be updated. When data detector circuit 125 is free to be updated, NPML coefficient update circuit 161 transfers a coefficient set 162 corresponding to the previously stored coefficient set 133. In one particular embodiment of the present invention, NPML coefficient update circuit 161 is an asynchronous FIFO where they are stored until data detector circuit 125 is free to be updated.

Figure 1B:
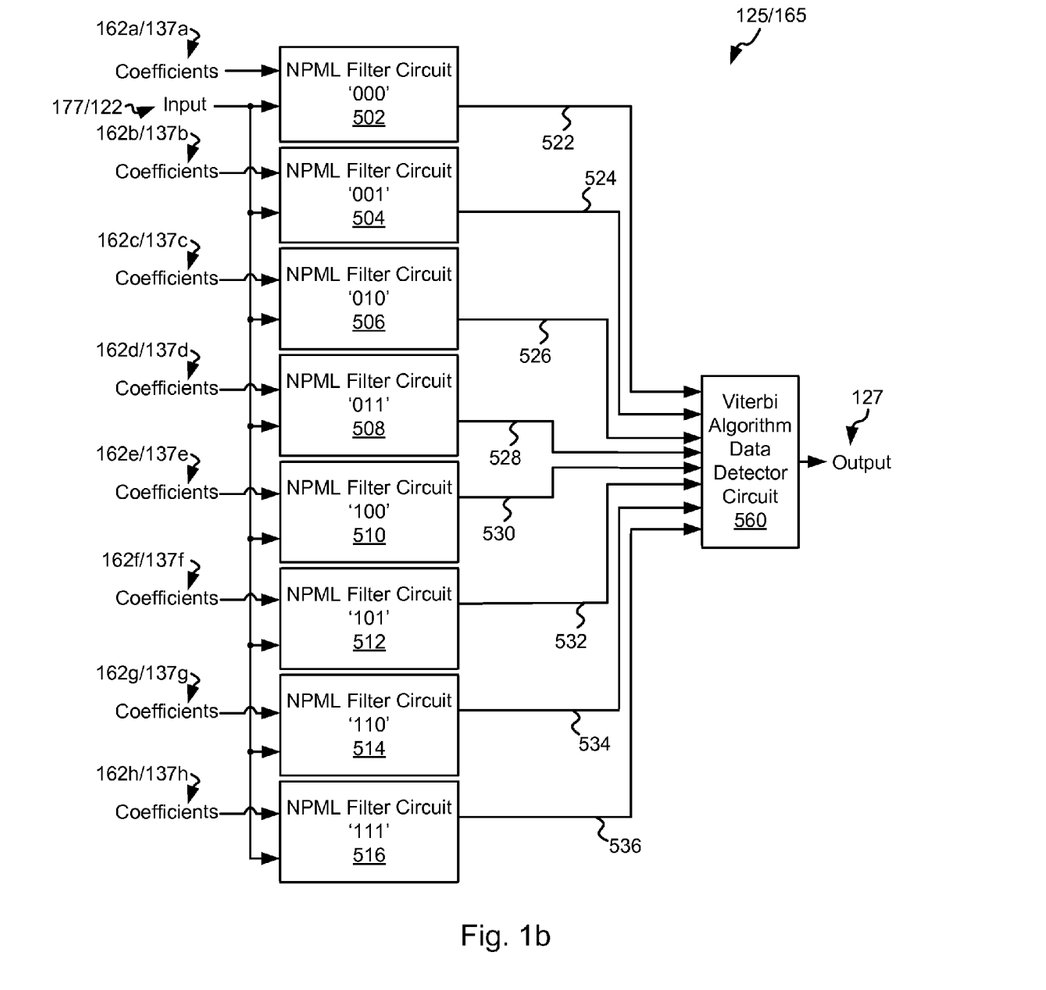

Turning to FIG. 1b, a detailed block diagram of one implementation of data detector circuit 125 and data detector 165 is shown. It should be noted that other implementations are possible in accordance with different embodiments of the present invention. As shown, data detector circuit 125/165 includes a number of NPML filter circuits. In particular, data detector circuit 125/165 includes an NPML filter circuit 502 designed to detect a '000' pattern, an NPML filter circuit 504 designed to detect a '001' pattern, an NPML filter circuit 506 designed to detect a '010' pattern, an NPML filter circuit 508 designed to detect a '011' pattern, an NPML filter circuit 510 designed to detect a '100' pattern, an NPML filter circuit 512 designed to detect a '101' pattern, an NPML filter circuit 514 designed to detect a '110' pattern, and an NPML filter circuit 516 designed to detect a '111' pattern. Each of the aforementioned NPML filter circuits applies the NPML filtering to an input. The input may be either equalized output 122 or buffered data 177 depending upon the current global iteration being processed.

NPML filter circuit 502 provides a filtered output 522 to a Viterbi algorithm data detector circuit 560. It should be noted that Viterbi algorithm data detector circuit 560 may be replaced by another type of data detector circuit known in the art. NPML filter circuit 504 provides a filtered output 524 to Viterbi algorithm data detector circuit 560; NPML filter circuit 506 provides a filtered output 526 to Viterbi algorithm data detector circuit 560; NPML filter circuit 508 provides a filtered output 528 to Viterbi algorithm data detector circuit 560; NPML filter circuit 510 provides a filtered output 530 to Viterbi algorithm data detector circuit 560; NPML filter circuit 512 provides a filtered output 532 to Viterbi algorithm data detector circuit 560; NPML filter circuit 514 provides a filtered output 534 to Viterbi algorithm data detector circuit 560; and NPML filter circuit 516 provides a filtered output 536 to Viterbi algorithm data detector circuit 560. Filtered outputs 522, 524, 526, 528, 530, 532, 534, 536 correspond to respective branch metrics used by Viterbi algorithm data detector circuit 560.

Operation of NPML filter circuit 502 is governed by a coefficient set 162a (for data detector circuit 125) or a coefficient set 137a (for data detector circuit 165); operation of NPML filter circuit 504 is governed by a coefficient set 162b (for data detector circuit 125) or a coefficient set 137b (for data detector circuit 165); operation of NPML filter circuit 506 is governed by a coefficient set 162c (for data detector circuit 125) or a coefficient set 137c (for data detector circuit 165); operation of NPML filter circuit 508 is governed by a coefficient set 162d (for data detector circuit 125) or a coefficient set 137d (for data detector circuit 165); operation of NPML filter circuit 510 is governed by a coefficient set 162e (for data detector circuit 125) or a coefficient set 137e (for data detector circuit 165); operation of NPML filter circuit 512 is governed by a coefficient set 162f (for data detector circuit 125) or a coefficient set 137f (for data detector circuit 165); operation of NPML filter circuit 514 is governed by a coefficient set 162g (for data detector circuit 125) or a coefficient set 137g (for data detector circuit 165); and operation of NPML filter circuit 516 is governed by a coefficient set 162h (for data detector circuit 125) or a coefficient set 137h (for data detector circuit 165). Coefficient sets 162a-h are received as coefficient sets 162 from NPML coefficient update circuit 161, and coefficient sets 137a-h are received as coefficient sets 137 from NPML coefficient update circuit 135.

As set forth above, forced variance NPML calibration circuit 130 is operable to calculate coefficient sets that each include coefficients, a bias value, and a variance value. In embodiments of the present invention, the variance value for the first NPML filter circuit (e.g., NPML filter circuit 502) is forced to be equal to forced variance target 168 while the bias value and the coefficients are adjusted. This adjustment operates to repeatedly modify the coefficients and bias value to reduce the error between equalized output 122 and detected output 167. The resulting coefficients and bias values are provided to NPML filtered circuit 502 where they are used to calculate filtered output 522 in accordance with the following equation:

Filtered Output 522=Input 177/122*NPFIR Filter of NPML Filter Circuit 502.

In addition, an edgemean value is calculated for Viterbi algorithm detector circuit 560 in accordance with the following equation:

Edgemean=Detected Output 167*NPFIR Filter of NPML Filter Circuit 502+bias value.

For a Gaussian random variable, $$p = \frac{1}{\sqrt{2\pi}\,\delta} e^{\frac{(x-\mu)^2}{2\delta^2}}.$$

If you take the log(p), then the branch metric used by Viterbi algorithm data detector circuit 560 is calculated in accordance with the following equation:

$$BranchMetric = -\log(\sqrt{2\pi}\,\delta_i) - \frac{(\text{Filtered Output } 522 - Edgemean_i)^2}{2\delta_i^2},$$

where i represents the particular NPML filter circuit (e.g., i=0 corresponds to NPML filter circuit 502, i=1 corresponds to NPML filter circuit 504, i=2 corresponds to NPML filter circuit 506, i=3 corresponds to NPML filter circuit 508, i=4 corresponds to NPML filter circuit 508, i=5 corresponds to NPML filter circuit 510, i=6 corresponds to NPML filter circuit 512, i=7 corresponds to NPML filter circuit 514, and i=7 corresponds to NPML filter circuit 516).

The term $-\log(\sqrt{2\pi}\delta_i)$ is referred to as a logterm, and the aforementioned branch metric equation may be rearranged to yield:

$$BranchMetric = \frac{A}{2\delta_o^2}\left[\frac{(\text{Filtered Output } 522 - Edgemean_i)^2}{A} + \frac{2\delta_o^2}{A}logterm\right]$$

By forcing the variance (i.e., $\delta_o^2$) equal to A/2 during the adaptation performed by forced variance NPML calibration circuit 130, the term $$\frac{A}{2\delta_o^2}$$

is equal to unity (1), therefore simplifying the branch metric equation as follows:

$$BranchMetric = \frac{(\text{Filtered Output 522} - Edgemean_i)^2}{A} + logterm.$$

'A' can be set to a value which may be, for example, a power of 2 including 4, 8, 16 . . . .

In addition, forced variance NPML calibration circuit 130 repeatedly modifies any of the respective coefficients, bias values, and/or variance values for each of NPML filter circuits 504, 506, 508, 510, 512, 514, 516. The resulting adaptive values are normalized to forced variance target 168. By normalizing the variance value for each of the NPML filter circuits to forced variance target 168, the branch metric calculation for data from each of the NPML filters is as follows:

$$BranchMetric = \frac{(\text{Filtered Output 522} - Edgemean_i)^2}{A} + logterm.$$

Figure 2A:
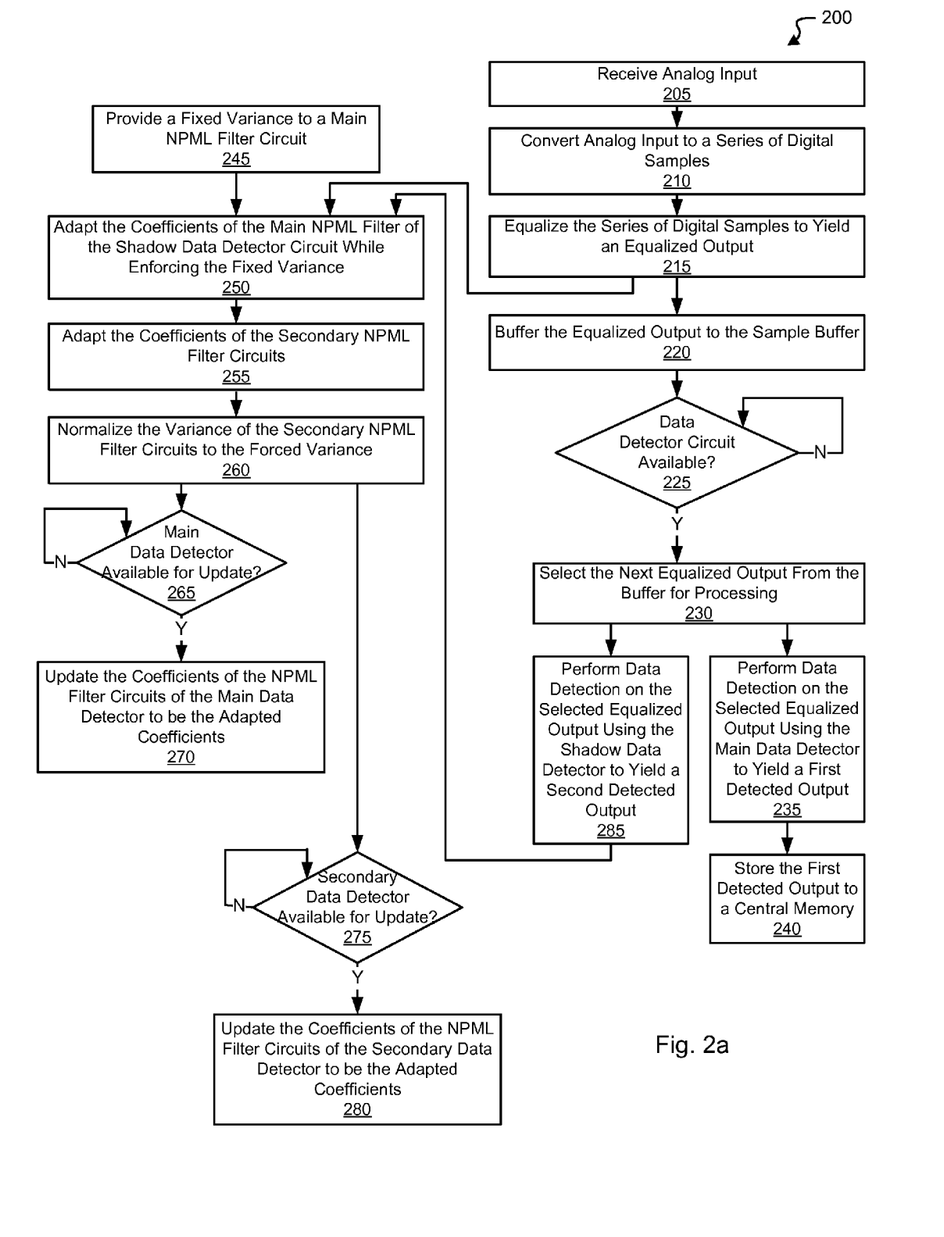
FIGS. 2a-2b are flow diagrams showing a method in accordance with some embodiments of the present invention for forced variance NPML calibration.
Figure 2B:
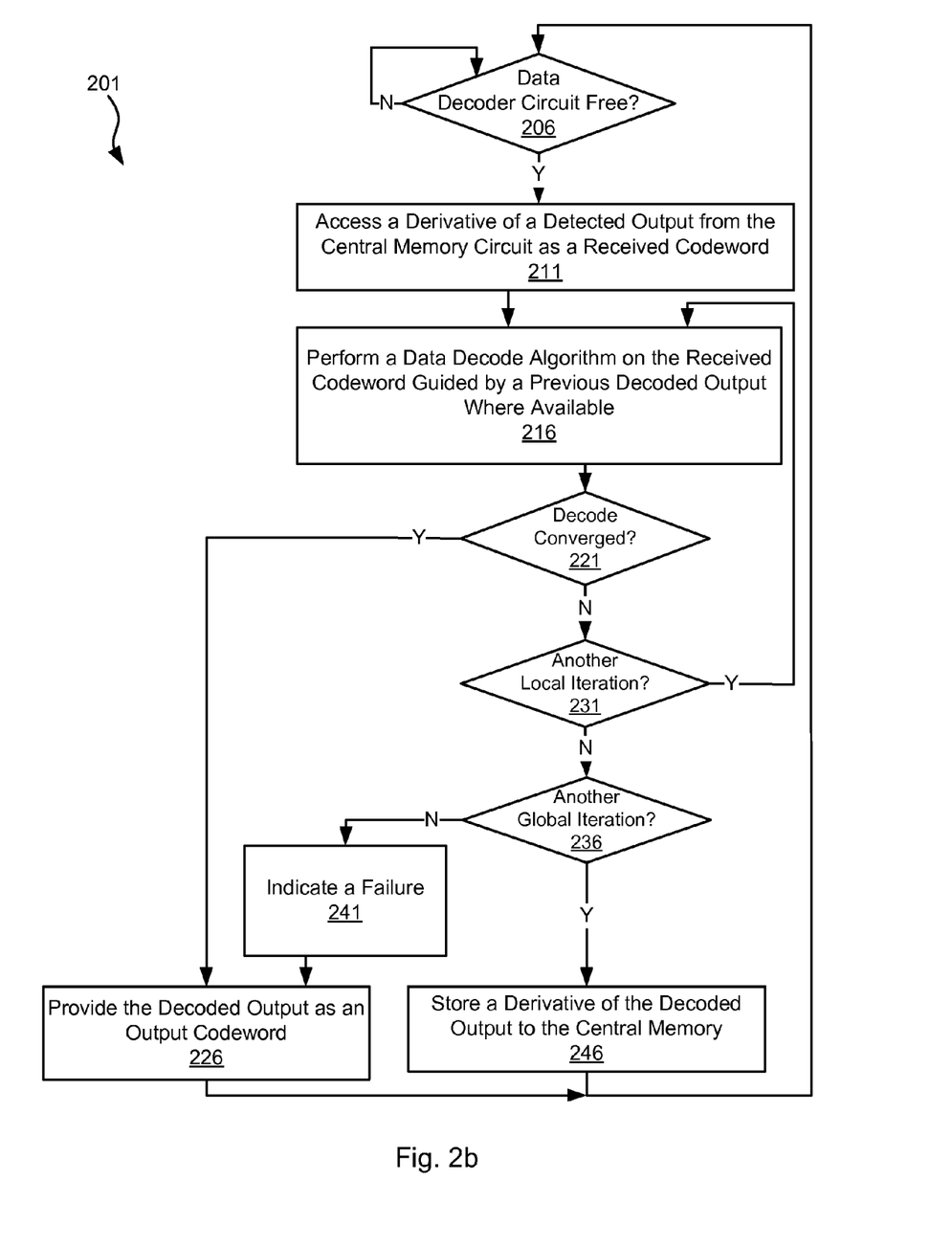

Turning to FIGS. 2a-2b, flow diagrams 200, 201 show a method in accordance with some embodiments of the present invention for forced variance NPML calibration. Following flow diagram 200 of FIG. 2a, an analog input is received (block 205). The analog input may be derived from, for example, a storage medium or a data transmission channel. Based upon the disclosure provided herein, one of ordinary skill in the art will recognize a variety of sources of the analog input. The analog input is converted to a series of digital samples (block 210). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 215). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention. The equalized output is buffered (block 220).

It is determined whether a data detector circuit is available (block 225). Where the data detector circuit is available (block 225), the next equalized output from the sample buffer is selected for processing (block 230), and a data detection is performed on the selected equalized output using the main data detector to yield a first detected output (block 235). Where it is the second or later global iteration for the selected equalized output, a previously generated decoder output is used to guide performance of the data detection. The data detection may be, but is not limited to, a Viterbi algorithm data detection or a maximum a posteriori data detection. Based upon the disclosure provided herein, one of ordinary skill in the art will recognize other data detection algorithms that may be used in relation to different embodiments of the present invention. The first detected output is then stored to a central memory where it awaits the availability of a downstream data decoder circuit (block 240).

In parallel, a data detection algorithm is applied to the selected equalized output using a shadow data detector circuit to yield a second detected output (block 285). In some embodiments of the present invention, the data detection algorithm applied by the shadow data detector circuit may be identical to that applied by the main data detector circuit. In other embodiments of the present invention, the data detection algorithm applied by the shadow data detector circuit may be a simplified data detection algorithm. Both the main data detector circuit and the shadow data detector circuit include a number of NPML filter circuits that provide filtered outputs used to calculate branch metric values. Operation of each of the NPML filter circuits is governed by coefficients, and calculation of the branch metric values is based at least in part on a bias value.

Also in parallel, a fixed variance value is provided to a main one of the NPML filter circuits (block 245). The coefficients and bias value used by the main one of the NPML filter circuits are allowed to adapt to reduce the difference between the second detected output and the equalized output to yield an improved NPML filtering (block 250). This is done in relation to the data detector circuit while maintaining a variance between the coefficients fixed at the received fixed variance value. In addition, the coefficients, bias value and variance value of each of the other NPML filters are adapted to reduce the difference between the second detected output and the equalized output to yield an improved NPML filtering (block 255). The adapted coefficients and bias value for each of the other NPML filter circuits are normalized to the received fixed variance value such that all of the NPML filters exhibit the same fixed variance value (block 260). It is determined whether the main data detector circuit is available for update (block 265). Where the main data detector is available to be updated (block 265), the main data detector is loaded with the updated NPML coefficients (block 270). In some cases, an update of the coefficients is done between processing sectors of data. It is also determined whether the shadow data detector is available to be updated (block 275). Where the shadow data detector is available to be updated (block 275), the shadow data detector is loaded with the updated NPML coefficients (block 280).

Turning to FIG. 2b and following flow diagram 201, in parallel to the previously described data detection process, it is determined whether a data decoder circuit is available (block 206). The data decoder circuit may be, for example, a low density data decoder circuit as are known in the art. Where the data decoder circuit is available (block 206), a previously stored derivative of a detected output is accessed from the central memory and used as a received codeword (block 211). A data decode algorithm is applied to the received codeword to yield a decoded output (block 216). It is then determined whether the decoded output converged (e.g., resulted in the originally written data as indicated by the lack of remaining unsatisfied checks) (block 221). Where the decoded output converged (block 221), the converged codeword is provided as a decoded output (block 226).

Alternatively, where the decoded output failed to converge (e.g., errors remain) (block 221), it is determined whether another local iteration is desired (block 231). In some cases, as a default seven local iterations are allowed per each global iteration. Based upon the disclosure provided herein, one of ordinary skill in the art will recognize another default number of local iterations that may be used in relation to different embodiments of the present invention. Where another local iteration is desired (block 231), the data decode algorithm is re-applied using the current decoded output as a guide (block 216).

Alternatively, where another local iteration is not desired (block 231), it is determined whether another global iteration is allowed (block 236). As a default, another global iteration is allowed where there is sufficient available space in the central memory and an output memory reordering queue to allow another pass through processing the currently processing codeword. The amount of available space in the central memory and an output memory reordering queue is a function of how many iterations are being used by concurrently processing codewords to converge. For more detail on the output queue time limitation see, for example, U.S. patent application Ser. No. 12/114,462 entitled "Systems and Methods for Queue Based Data Detection and Decoding", and filed May 8, 2008 by Yang et al. The entirety of the aforementioned reference is incorporated herein by reference for all purposes. Thus, the amount of time that a codeword may continue processing through global iterations is a function of the availability of central memory and an output memory reordering queue. By limiting the number of global iterations that may be performed, the amount of time a codeword may continue processing through global iterations can be reduced.

Where another global iteration is allowed (block 236), a derivative of the decoded output is stored to the central memory (block 246). The derivative of the decoded output being stored to the central memory triggers the data set ready query of block 205 to begin the data detection process. Alternatively, where another global iteration is not allowed (block 536), a failure to converge is indicated (block 241), and the current decoded output is provided (block 226).

Figure 3:
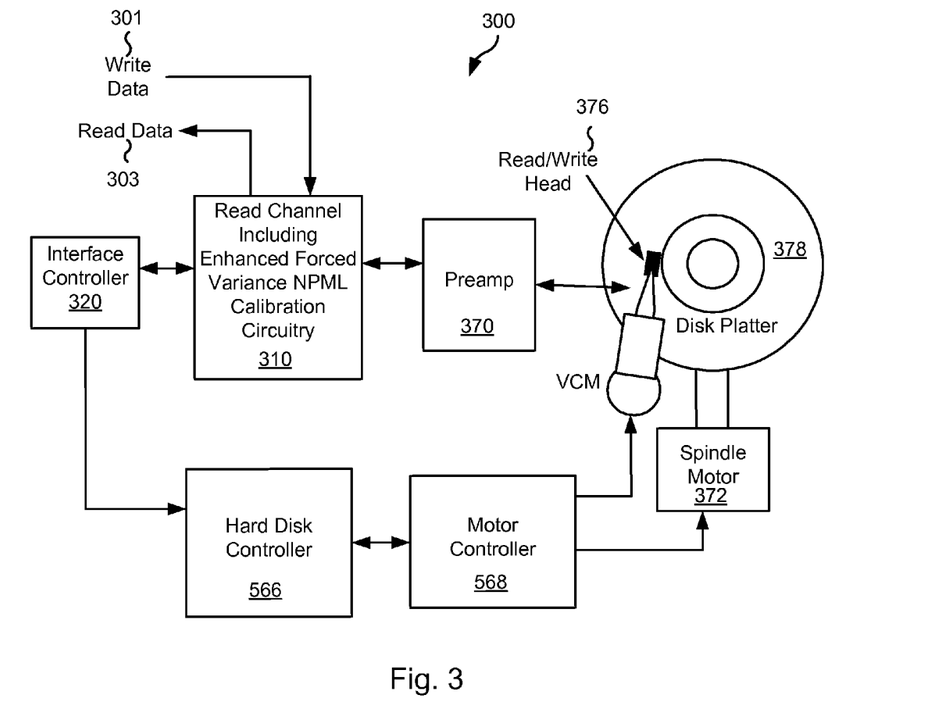
FIG. 3 shows a storage device including a read channel having forced variance NPML calibration circuitry in accordance with one or more embodiments of the present invention.

Turning to FIG. 3, a storage system 300 including a read channel circuit 310 having forced variance NPML calibration circuitry is shown in accordance with some embodiments of the present invention. Storage system 300 may be, for example, a hard disk drive. Storage system 300 also includes a preamplifier 370, an interface controller 320, a hard disk controller 366, a motor controller 368, a spindle motor 372, a disk platter 378, and a read/write head assembly 376. Interface controller 320 controls addressing and timing of data to/from disk platter 378. The data on disk platter 378 consists of groups of magnetic signals that may be detected by read/write head assembly 376 when the assembly is properly positioned over disk platter 378. In one embodiment, disk platter 378 includes magnetic signals recorded in accordance with either a longitudinal or a perpendicular recording scheme.

In a typical read operation, read/write head assembly 376 is accurately positioned by motor controller 368 over a desired data track on disk platter 378. Motor controller 368 both positions read/write head assembly 376 in relation to disk platter 378 and drives spindle motor 372 by moving read/write head assembly to the proper data track on disk platter 378 under the direction of hard disk controller 366. Spindle motor 372 spins disk platter 378 at a determined spin rate (RPMs). Once read/write head assembly 378 is positioned adjacent the proper data track, magnetic signals representing data on disk platter 378 are sensed by read/write head assembly 376 as disk platter 378 is rotated by spindle motor 372. The sensed magnetic signals are provided as a continuous, minute analog signal representative of the magnetic data on disk platter 378. This minute analog signal is transferred from read/write head assembly 376 to read channel circuit 310 via preamplifier 370. Preamplifier 370 is operable to amplify the minute analog signals accessed from disk platter 378. In turn, read channel circuit 310 decodes and digitizes the received analog signal to recreate the information originally written to disk platter 378. This data is provided as read data 303 to a receiving circuit. A write operation is substantially the opposite of the preceding read operation with write data 301 being provided to read channel circuit 310. This data is then encoded and written to disk platter 378.

During a read operation, data is sensed from disk platter 378 and processed through a data processing circuit including a data detector circuit and a data decoder circuit. Convergence on the originally written data set may involve one or more global iterations through both the data detector circuit and the data decoder circuit, and one or more local iterations through the data decoder circuit for each global iteration. The data detector circuit includes one or more NPML filtering circuits. Filter coefficients used to govern the NPML filter circuits are adapted using a forced variance for at least one of the NPML filter circuits, and in some cases by normalizing the other filter coefficients such that the variance between the normalized coefficients is the same as the forced variance. In some embodiments of the present invention, data processing circuits similar to that discussed above in relation to FIGS. 1a-1b may be used, and/or the processing may be done similar to that discussed above in relation to FIGS. 2a-2b.

It should be noted that storage system 300 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 300, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 310 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 300 may be modified to include solid state memory that is used to store data in addition to the storage offered by disk platter 378. This solid state memory may be used in parallel to disk platter 378 to provide additional storage. In such a case, the solid state memory receives and provides information directly to read channel circuit 310. Alternatively, the solid state memory may be used as a cache where it offers faster access time than that offered by disk platted 378. In such a case, the solid state memory may be disposed between interface controller 320 and read channel circuit 310 where it operates as a pass through to disk platter 378 when requested data is not available in the solid state memory or when the solid state memory does not have sufficient storage to hold a newly written data set. Based upon the disclosure provided herein, one of ordinary skill in the art will recognize a variety of storage systems including both disk platter 378 and a solid state memory.

Figure 4:
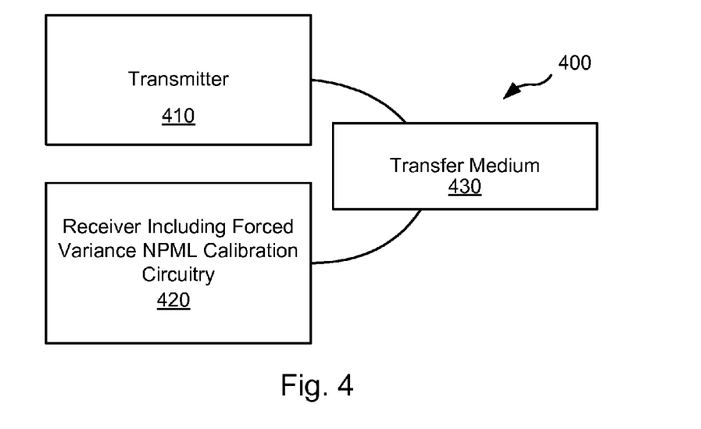
FIG. 4 shows a data transmission device including a receiver having forced variance NPML calibration circuitry in accordance with some embodiments of the present invention.

Turning to FIG. 4, a data transmission device 400 including a receiver 420 having enhanced NPML calibration circuitry is shown in accordance with some embodiments of the present invention. Data transmission system 400 includes a transmitter 410 that is operable to transmit encoded information via a transfer medium 430 as is known in the art. The encoded data is received from transfer medium 430 by receiver 420.

During operation, data is received by receiver 420 via transfer medium 430 where it is processed through a data processing circuit including a data detector circuit and a data decoder circuit. Convergence on the originally written data set may involve one or more global iterations through both the data detector circuit and the data decoder circuit, and one or more local iterations through the data decoder circuit for each global iteration. The data detector circuit includes one or more NPML filtering circuits. Filter coefficients used to govern the NPML filter circuits are adapted using a forced variance for at least one of the NPML filter circuits, and in some cases by normalizing the other filter coefficients such that the variance between the normalized coefficients is the same as the forced variance. In some embodiments of the present invention, data processing circuits similar to that discussed above in relation to FIGS. 1a-1b may be used, and/or the processing may be done similar to that discussed above in relation to FIGS. 2a-2b.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
   a first noise predictive filter circuit, wherein operation of the first noise predictive filter circuit is based at least in part on a first coefficient set;
   a second noise predictive filter circuit, wherein operation of the second noise predictive filter circuit is based at least in part on a second coefficient set; and
   a forced variance filter coefficient adaptation circuit operable to adapt the first coefficient set and the second coefficient set while constraining at least one of a first variance of the first coefficient set and a second variance of the second coefficient set to a defined variance.

2. The data processing system of claim 1, wherein adapting the first coefficient set and the second coefficient set includes constraining the first variance to the defined variance, and normalizing the second coefficient set such that the second variance is approximately equal to the first variance.

3. The data processing system of claim 1, wherein adapting the first coefficient set and the second coefficient set includes modifying the first coefficient set while constraining the first variance to the defined variance, and modifying the second coefficient set while constraining the second variance to the defined variance.

4. The data processing system of claim 1, wherein the first noise predictive filter circuit and the second noise predictive filter circuit are included in a data detection circuit, and wherein the data detection circuit further comprises:
   a data detector circuit operable to apply a data detection algorithm guided by a first filtered output from the first noise predictive filter circuit and a second filtered output from the second noise predictive filter circuit, wherein the data detection algorithm includes a branch metric calculation performed without relying on the first variance and the second variance.

5. The data processing system of claim 4, wherein the data detection algorithm is a Viterbi data detection algorithm.

6. The data processing system of claim 4, wherein the defined variance is selected such that the branch metric calculation can be done without the first variance and the second variance.

7. The data processing system of claim 4, wherein the data processing system further comprises:
   a data decoder circuit operable to apply a data decoding algorithm to the detected output to yield a decoded output.

8. The data processing system of claim 7, wherein the data decoding algorithm is a low density parity check algorithm.

9. The data processing system of claim 4, wherein the first coefficient set is updated to the first noise predictive filter circuit and the second coefficient set is updated to the second noise predictive filter circuit using a coefficient update circuit operable to maintain the first coefficient set and the second coefficient set between data sets processed by the data detector circuit.

10. The data processing system of claim 1, wherein the data processing system is implemented as part of a device selected from a group consisting of: a storage device and a receiving device.

11. The data processing system of claim 1, wherein the data processing system is implemented as part of an integrated circuit.

12. A method, the method comprising:
adaptively calculating a first coefficient set, wherein a variance of the first coefficient set is forced to a defined variance;
adaptively calculating a second coefficient set;
applying the first coefficient set to a first noise predictive filter circuit, wherein operation of the first noise predictive filter circuit is governed at least in part based on the first coefficient set; and
applying a filter control derived from the second coefficient set to a second noise predictive filter circuit, wherein operation of the second noise predictive filter circuit is governed at least in part based on the second coefficient set.

13. The method of claim 12, wherein the method further comprises:
normalizing the second coefficient set such that a variance of a resulting normalized coefficient set is approximately the same as the defined variance, wherein the filter control is the normalized coefficient set.

14. The method of claim 12, wherein the method further comprises:
applying a data detection algorithm guided by a first filtered output from the first noise predictive filter circuit and a second filtered output from the second noise predictive filter circuit, wherein the data detection algorithm includes a branch metric calculation performed without relying on the variance.

15. The method of claim 14, wherein the data detection algorithm is a Viterbi data detection algorithm.

16. The method of claim 14, wherein the method further comprises:
selecting the defined variance is selected such that the branch metric calculation can be done without the first variance and the second variance.

17. The method of claim 14, wherein the method further comprises:
applying a low density parity check algorithm to the detected output to yield a decoded output.

18. The method of claim 14, wherein the method further comprises:
updating the first coefficient set to the first noise predictive filter circuit; and
updating the second coefficient set is updated to the second noise predictive filter.

19. A storage device, the storage device comprising:
a storage medium;
a head assembly disposed in relation to the storage medium and operable to provide a sensed signal corresponding to information on the storage medium;
a read channel circuit including:
an analog front end circuit operable to provide an analog signal corresponding to the sensed signal;
an analog to digital converter circuit operable to sample the analog signal to yield a series of digital samples;
an equalizer circuit operable to equalize the digital samples to yield a sample set;
a data detector circuit operable to apply a data detection algorithm to the sample set to yield a detected output, wherein the data detector circuit includes:
a first noise predictive filter circuit, wherein operation of the first noise predictive filter circuit is based at least in part on a first coefficient set;
a second noise predictive filter circuit, wherein operation of the second noise predictive filter circuit is based at least in part on a second coefficient set; and
a forced variance filter coefficient adaptation circuit operable to adapt the first coefficient set and the second coefficient set while constraining at least one of a first variance of the first coefficient set and a second variance of the second coefficient set to a defined variance.

20. The storage device of claim 19, wherein the storage medium includes both a magnetic storage medium and a solid state memory device.

* * * * *